United States Patent Office 3,458,367
Patented July 29, 1969

3,458,367

METHOD OF MANUFACTURE OF SUPERHIGH FREQUENCY TRANSISTOR

Matami Yasufuku, Yokohama-shi, Japan, assignor to Fujitsu Limited, Kawasaki, Japan, a corporation of Japan Filed July 12, 1965, Ser. No. 471,371
Claims priority, application Japan, July 18, 1964, 39/40,992
Int. Cl. H01l 7/36
U.S. Cl. 148—175 2 Claims

ABSTRACT OF THE DISCLOSURE

A superhigh frequency transistor is manufactured by depositing base impurities on the upper surface of a body of semiconductor material. The base impurities are at least partly diffused into the body to provide an area of opposite conductivity type from that of the body. An epitaxial layer of the same conductivity type as the body is grown on the upper surface of the body. The base impurities are further diffused into the epitaxial layer to extend to the upper surface of the body. An emitter is diffused in the area of the base impurities.

The present invention relates to a method of manufacture of a superhigh frequency transistor.

The cutoff frequency *ft* of a superhigh frequency transistor is determined by four factors. These factors are the emitter time constant T*e*=C*e*r*e* which involves the emitter capacitance C*e* and the emitter resistance *re* between the emitter and the base, the base passing time T*b*, the collector time constant T*c*=C*c*r*c* which involves the collector capacitance C*c* and the collector resistance *rc*, and the collector depletion layer time T*sc*.

In a known type of silicon transistor the base passing time T*b* and the collector time constant T*c* have been made small by epitaxial process, but a small emitter time constant T*e* has not been provided. The emitter time constant T*e* is difficult to determine. In order to provide a small emitter time constant T*e*, efforts have been made to reduce the emitter capacitance C*e* by reducing the area of the emitter to a degree limited by the size of the other components and by reducing the surface concentration of the emitter. It is very difficult to reduce the surface concentration only of a silicon body, however.

The principal object of the present invention is to provide a method of manufacture of an new and improved superhigh frequency transistor.

An object of the present invention is to provide a method of manufacture of a superhigh frequency transistor having a sharply increased cutoff frequency.

Another object of the present invention is to provide a method of manufacture of a superhigh frequency transistor having a desirable high frequency characteristic.

Another object of the present invention is to provide a method of manufacture of a superhigh frequency transistor having a small emitter capacitance.

Another object of the present invention is to provide a method of manufacture of a superhigh frequency transistor suited for small current operation.

Another object of the present invention is to provide a method of manufacture of a superhigh frequency transistor which operates at a decreased switching time.

In accordance with the present invention, a method of manufacture of a superhigh frequency transistor comprises the steps of depositing base impurities on the upper surface of a body of semiconductor material, at least partly diffusing the base impurities into the body of semiconductor material, epitaxially growing an epitaxial layer on the upper surface of the body of semiconductor material, further diffusing the base impurities into the epitaxial layer to extend to the upper surface of the body of semiconductor material, and forming an emitter in the area of the base impurities at the upper surface of the body of semiconductor material.

Figure 1:
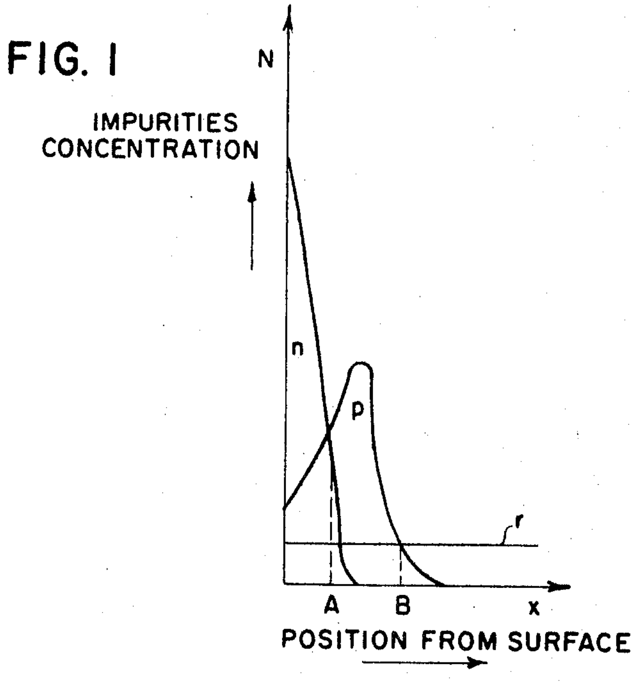
Figure 2A:
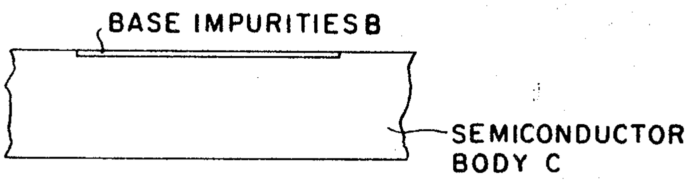
Figure 2B:
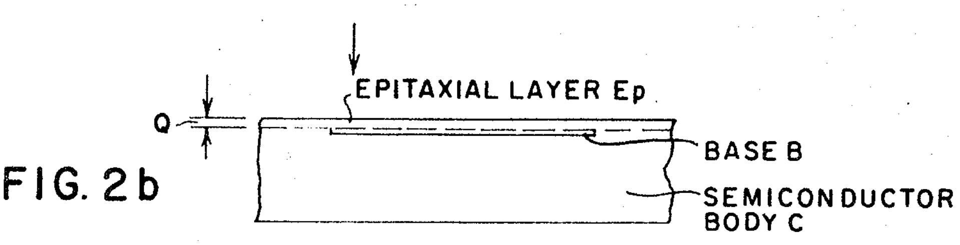
Figure 2C:
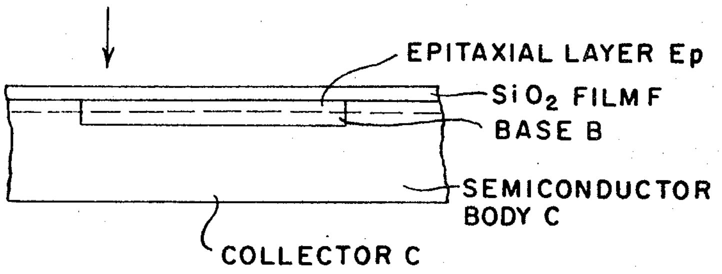
Figure 3A:
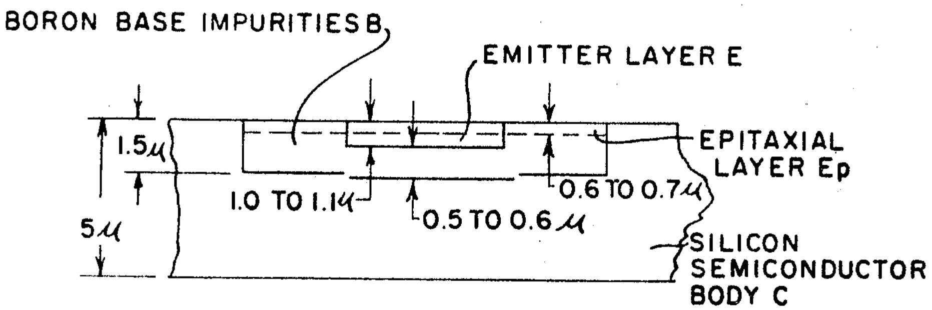
Figure 3B:
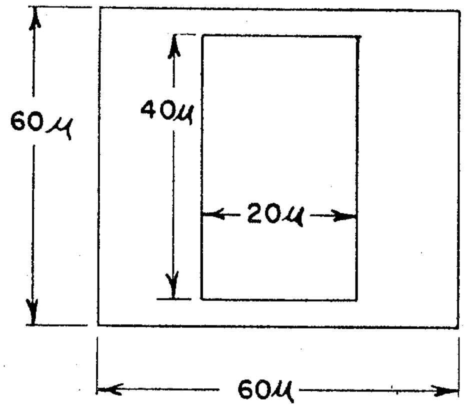
Figure 4:
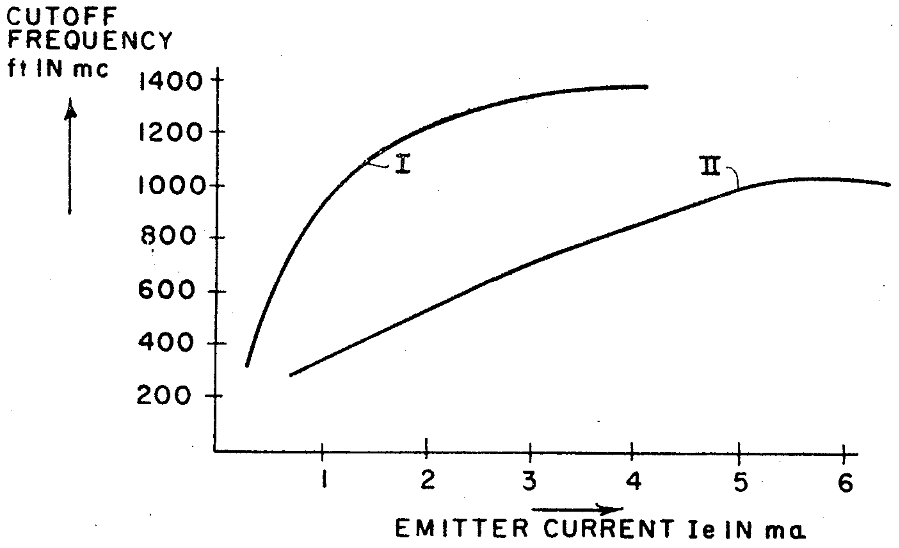

In order that the present invention may be readily carried into effect, it will now be described with reference to the accompanying drawings, wherein:

FIG. 1 is a graphical presentation of an ideal impurities distribution in a superhigh frequency transistor;

FIGS. 2*a*, 2*b* and 2*c* are diagrams illustrative of the steps of the method of the present invention;

FIGS. 3*a* and 3*b* are two views of a schematic diagram of an embodiment of a superhigh frequency transistor made by the method of the present invention; and FIG. 4 is a graphical presentation of emitter current versus cutoff frequency curves.

FIG. 1 indicates the ideal impurities distribution in a superhigh frequency transistor having a small emitter capaciance and a drift electric field. In FIG. 1, the abscissa represents the position from the surface and the ordinate represents the impurities concentration N. The point A on the abscissa indicates the emitter-base junction, the point B on the abscissa indicates the base-collector junction and the N and P regions are indicated by *n* and *p*, respectively.

As indicated in FIG. 1, the concentration of impurities in the emitter-base junction is low and as the base is approached from the emitter the concentration of impurities increases sharply. As the collector is approached from the base, in the base-collector junction, the impurities concentration decreases. If the drift field can be made small with relation to the injection carriers, the base passing time T*b* may be made small, the base diffusion resistance *r* may be made small and the emitter time constant T*e* may be made small by making the emitter capacitance C*e* small.

The method of the present invention is illustrated by the diagrams of FIGS. 2*a*, 2*b* and 2*c*. In FIG. 2*a*, base impurities B are deposited on and may be partly diffused into a semiconductor body C in the manner of producing a known type planar transistor. The oxidized film covering the entire upper surface of the semiconductor body C or the base portion of said upper surface is then removed. FIG. 2*a* illustrates the case where the oxidized film is removed from the entire upper surface of the semiconductor body.

If an NPN transistor is manufactured, an epitaxial layer E*p* is formed by epitaxial growth of the semiconductor body C on the entire upper surface or on the base portion of the upper surface of said semiconductor body, as shown in FIG. 2*b*. The epitaxial layer E*p* has a specific resistance of N or is of N conductivity type. At a cutoff frequency of approximately 1000 megacycles per second the thickness Q of the epitaxial layer E*p* is approximately 0.3 to 2.0 microns. The epitaxial layer E*p* may be provided with a greater thickness than 2 microns.

The base impurities B are then further diffused into the epitaxial layer E*p*, so that the base B is then extended to the upper surface of the semiconductor body. The ideal impurities distribution shown in FIG. 1 may then be provided by regulating the diffusion time of the base impurities B and the thickness of the epitaxial layer E*p*.

An oxidized film F of silicon dioxide is applied at the same time to the epitaxial layer E*p* with the exception of an area of said layer which then forms the emitter in the usual manner.

In the manufacture of a superhigh frequency transistor by the method of the present invention, boron may be deposited on an N conductivity type silicon substrate having a specific resistance of 0.5 to 0.8 ohm centimeter; the silicon substrate being the semiconductor body C and the boron being the base impurities B, as shown in FIG. 3*a*. The boron base impurities B are partially diffused at 970° C. for 10 minutes into the silicon substrate C.

The silicon substrate C has a thickness of 5 microns and is positioned on an N conductivity type silicon body (not shown) having a thickness of 150 microns and a specific resistance of 0.01 ohm centimeter. An epitaxial layer E*p* having a specific resistance of 0.5 to .08 ohm centimeter is then grown on the silicon substrate C by the reaction $$SiCl_4+2\ H_2 \rightarrow Si+4\ HCl$$

An epitaxial layer E*p* having a thickness of 0.6 to 0.7 micron is provided by a 0.5 to 1.0 minute reaction at a temperature of 1150° C.

The base impurities B of boron are diffused into the epitaxial layer E*p* and the base layer is thus extended to the upper surface of the silicon substrate C. At such time, the impurity concentration at the surface of the base layer B is $10^{19}$ cm.$^{-3}$ and the depth of the base layer B is 1.5 microns. The substrate is then placed in $P_2O_5$ vapor for 3 minutes at 1100° C. The substrate is then heated for 5 to 10 minutes at 1100° C. in order to adjust the depth of diffusion and the emitter layer E is thereby diffused to a depth of 1.0 to 1.1 microns below the upper surface of the silicon substrate C. The impurity concentration at the surface of the emitter layer E is then $2\times10^{20}$ cm.$^{-3}$.

The area of the emitter may be dimensoioned at 20 by 40 microns and the area of the base may be dimensioned at 60 by 60 microns, as shown in FIG. 3*b*. In such a case, a frequency characteristic curve I, as shown in FIG. 4, is that of the transistor of FIGS. 3*a* and 3*b*, manufactured by the method of the present invention, as described with reference to FIGS. 3*a* and 3*b*. The frequency characteristic curve II of FIG. 4, is that of a known transistor of superhigh frequency type.

In FIG. 4, the abscissa represents the emitter current I*e*, in milliamperes and the ordinate represents the cutoff frequency *ft* in megacycles per second. As indicated by the curves I and II of FIG. 4, the cutoff frequency of the superhigh frequency transistor may be sharply increased and its frequency characteristic may be as desired, as is achieved in a transistor manufactured by the method of the present invention. The emitter capacitance C*e* may be made small and may thereby increase the cutoff frequency *ft*.

A superhigh frequency transistor manufactured by the method of the present invention is suited for small current operation and, due to a decrease in input capacitance, operates at a decreased switching time.

While the invention has been described by means of a specific example and in a specific embodiment, I do not wish to be limited thereto, for obvious modifications will occur to those skilled in the art without departing from the spirit and scope of the invention.

I claim:

1. A method of manufacture of a superhigh frequency transistor, comprising the steps of
   - depositing base impurities on the upper surface of a body of semiconductor material having a low resistance;
   - at least partly diffusing said base impurities into said body of semiconductor material to provide an area of opposite conductivity type from that of said body and producing a drift electric field;
   - growing an epitaxial layer of the same conductivity type as said body on the upper surface of said body of semiconductor material;
   - further diffusing said base impurities into said epitaxial layer to extend to the upper surface of said body of semiconductor material; and
   - diffusing an emitter in the area of the base impurities at the upper surface of said body of semiconductor material to provide a low impurity concentration in the emitter-base junction which increases sharply as the base is approached from the emitter.

2. A method of manufacture of a superhigh frequency transistor, comprising the steps of
   - depositing boron on the upper surface of a silicon body having a low resistance;
   - at least partly diffusing said boron into said silicon body to provide an area of opposite conductivity type from that of said body and producing a drift electric field;
   - growing an epitaxial layer of the same conductivity type as said body on the upper surface of said silicon body;
   - further diffusing said boron into said epitaxial layer to extend to the upper surface of said silicon body; and
   - diffusing an emitter in the area of the boron at the upper surface of said silicon body to provide a low impurity concentration in the emitter-base junction which increases sharply as the base is approached from the emitter.

References Cited

UNITED STATES PATENTS

| | | | |
|---|---|---|---|
| 3,149,395 | 9/1964 | Bray et al. | 29—576 XR |
| 3,260,902 | 7/1966 | Porter | 148—175 XR |
| 3,275,910 | 9/1966 | Phillips | 317—235 |
| 3,328,213 | 6/1967 | Topas | 148—174 XR |

L. DEWAYNE RUTLEDGE, Primary Examiner

P. WEINSTEIN, Assistant Examiner

U.S. Cl. X.R.

29—576, 578; 148—33.5, 186, 187; 317—235